Jan. 7, 1964 E. R. SCHICKLER 3,117,286

TURRET-TYPE TUNER AMPLIFIER

Filed Sept. 2, 1960 4 Sheets-Sheet 1

INVENTOR.
EDWARD R. SCHICKLER
BY Daniel D. Sharp
ATTORNEY

Jan. 7, 1964 E. R. SCHICKLER 3,117,286

TURRET-TYPE TUNER AMPLIFIER

Filed Sept. 2, 1960 4 Sheets-Sheet 2

Jan. 7, 1964 E. R. SCHICKLER 3,117,286

TURRET-TYPE TUNER AMPLIFIER

Filed Sept. 2, 1960 4 Sheets-Sheet 4

United States Patent Office 3,117,286

Patented Jan. 7, 1964

3,117,286

TURRET-TYPE TUNER AMPLIFIER

Edward R. Schickler, Webster, N.Y., assignor to General Dynamics Corporation, Rochester, N.Y., a corporation of Delaware Filed Sept. 2, 1960, Ser. No. 53,829
8 Claims. (Cl. 330—65)

This invention relates to a switching device and, more particularly, to a turret-type tuner for tuning a power amplifier to any one of several discrete channels by a single switching operation.

One of the requirements of a sophisticated broadband communication equipment for communication involving high speed aircraft is that reliable communication be maintained substantially at all times. The time required for changing operating frequency must be relatively short in order to reduce the nonavailable period of the equipment to a minimum. Continuous tuning clearly is unsatisfactory in such cases since considerable time-consuming mechanical adjustment is required.

The necessary rapidity of tuning is accomplished by switching of selected tuned circuit elements whose electrical characteristics depend upon the frequency band of operation desired. In the power amplifier portion of such equipment, one of several output tuned circuits may be selectively connected in the output circuit of the power electron device and several input tuned circuits may be switched in the input circuit of the driver electron device.

It is essential to maintain short lead lengths between the selected tuned circuit and the associated electron device; this requirement is particularly critical over the higher frequency range. Another necessary feature is that the output tuned circuits be shielded not only from one another, but also that a selected output tuned circuit be shielded from a selected driver (input) tuned circuit and from the control portion of the driver electron device.

Since high speed tuning is essential, and since the size and weight of the output tuned circuits are rather large, the output tuned circuits are mounted in a fixed position and form a generally circumferential array surrounding the power amplifier electron device. The stationary mounting of the output tuned circuits not only avoids the disadvantages of movement of a relatively large rotating mass of comparatively large outer radius, but also makes it possible to take advantage of the variation in size of the several output tuned circuits in order to arrive at a minimum package size. The power amplifier electron device is fixedly mounted from the base of the tuner package and extends inside and adjacent to the array of output tuned circuits. A thin-walled cylinder or chimney of electrically insulating material surrounds the power amplifier device; this cylinder is driven by a prime mover. The position of the cylinder may be determined by appropriate control circuitry for the prime mover. The cylinder rotates between the power amplifier device and the array of output tuned circuits. Switching between the stationary power amplifier device and a selected fixed output tuned circuit is accomplished (1) by a first rotary contact mounted on the rotating cylinder and engaging a selected fixed contact which is connected to the corresponding stationary output tuned circuit and (2) by a resilient contact mounted on the inner periphery of the chimney connected to said first rotary contact and bearing against a slip ring on the peripheral output electrode of the power amplifier device. The rotating cylinder also serves as a chimney to direct cooling air, which may enter through an aperture in the base of the tuner, past the power amplifier device. A portion of the air directed through the chimney or cylinder may be diverted through an aperture in the wall of the chimney into the vicinity of the selected output tuned circuit for dissipating heat generated within that tuned circuit.

The turret tuner further includes a circumferentially arranged array of input tuned circuits coupled between the driver device and the power amplifier device. Since the input circuits are small compared with the output tuned circuits, the mass and peripheral radius of the array of input circuits is relatively small; consequently, they may be mounted for rotation with the rotating cylinder. Because the rotating portion of the turret tuner, including the chimney and the rotating array of input tuned circuits, is of relatively small mass and radius, the moment of inertia is correspondingly small. Switching between the driver device and the input tuned circuits is achieved by a set of fixed contacts electrically connected to the driver device and engaging a first set of rotary contacts which rotate with the rotating input tuned circuits. Each of the input tuned circuits is connected to one only of the first set of rotary contacts and also to one only of a second set of rotary contacts which is mounted on the rotating chimney; one of the second set of rotary contacts may selectively engage a fixed contactor forming a portion of the stationary power amplifier device socket assembly.

In certain applications, particularly those wherein the number of input and output tuned circuits differ, it is advantageous to use two independently driven chimneys of substantially the same radius mounted in alignment with one another. One chimney carries contacts for switching in a selected output tuned circuit, while the other chimney carries rotary contacts for switching the various input tuned circuits.

Other objects and features of this invention will become more evident by referring to the drawings wherein.

Figure 2:
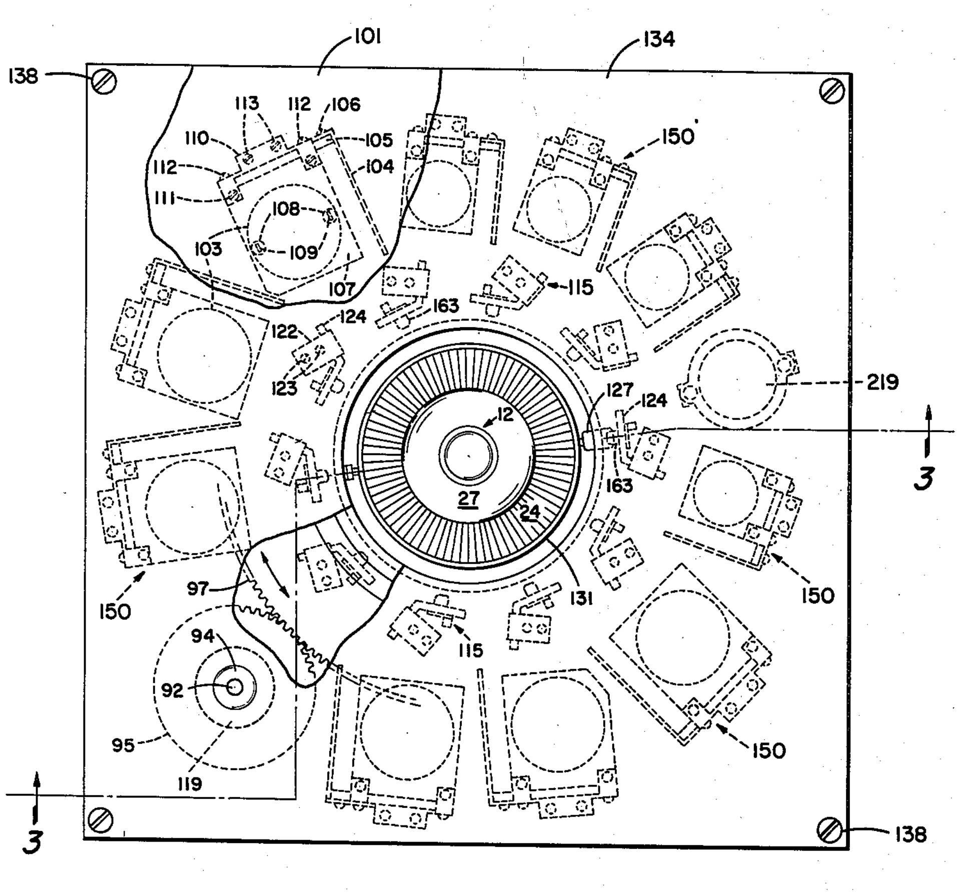
FIG. 2 is a plan view of a second embodiment of the invention.
Figure 3:
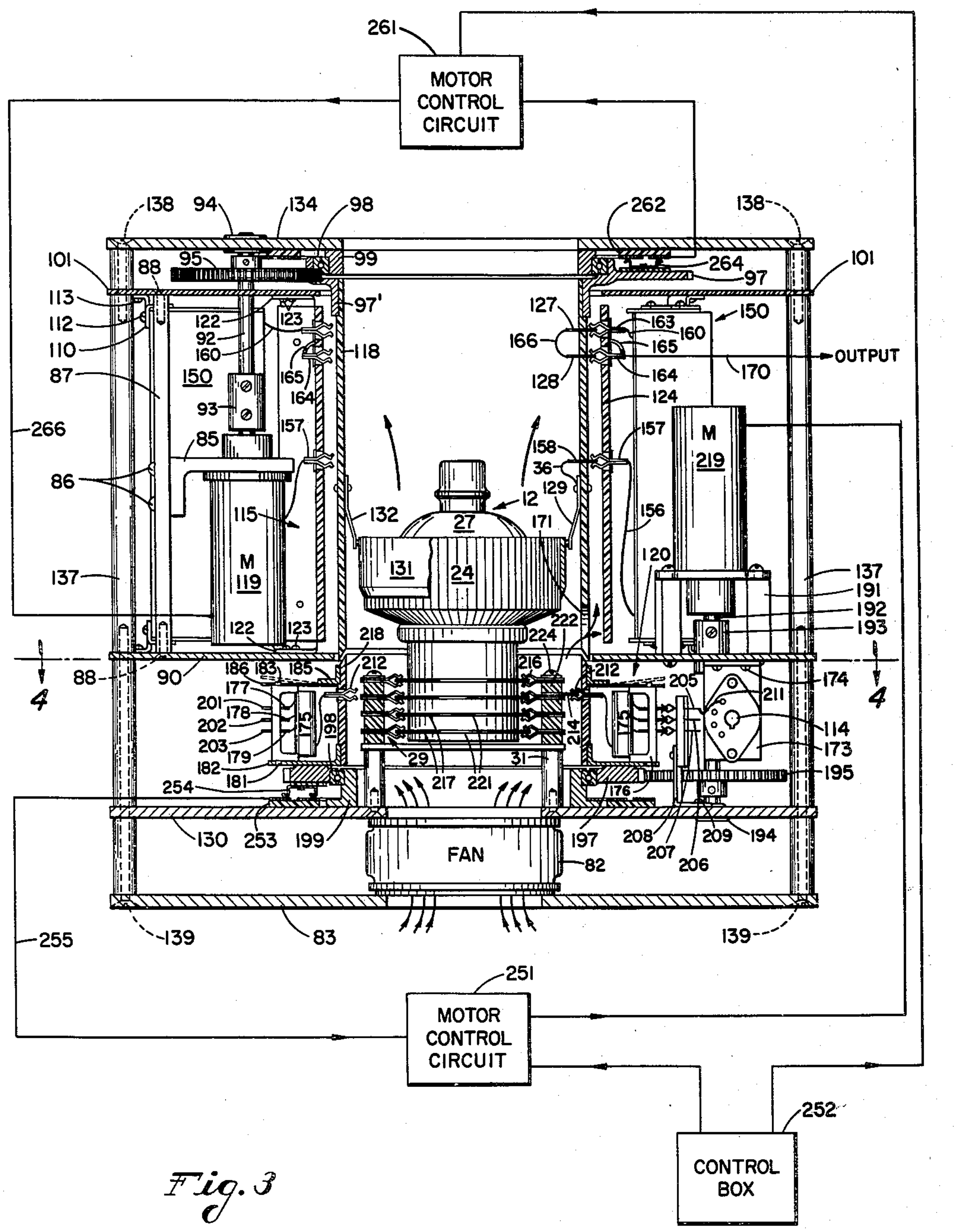
Figure 4:
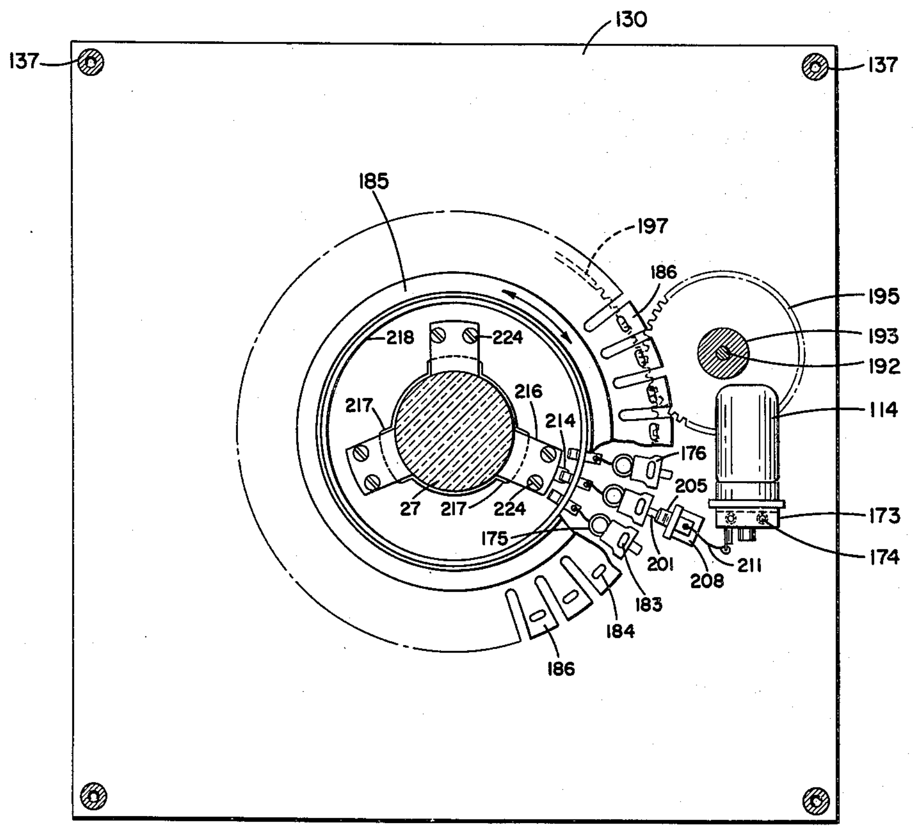

FIG. 3 is a cross-sectional view of the device of FIG. 2 taken along line 3—3 of FIG. 2; and FIG. 4 is a view of the device of FIGS. 2 and 3 taken along line 4—4 of FIG. 3.

Figure 1:
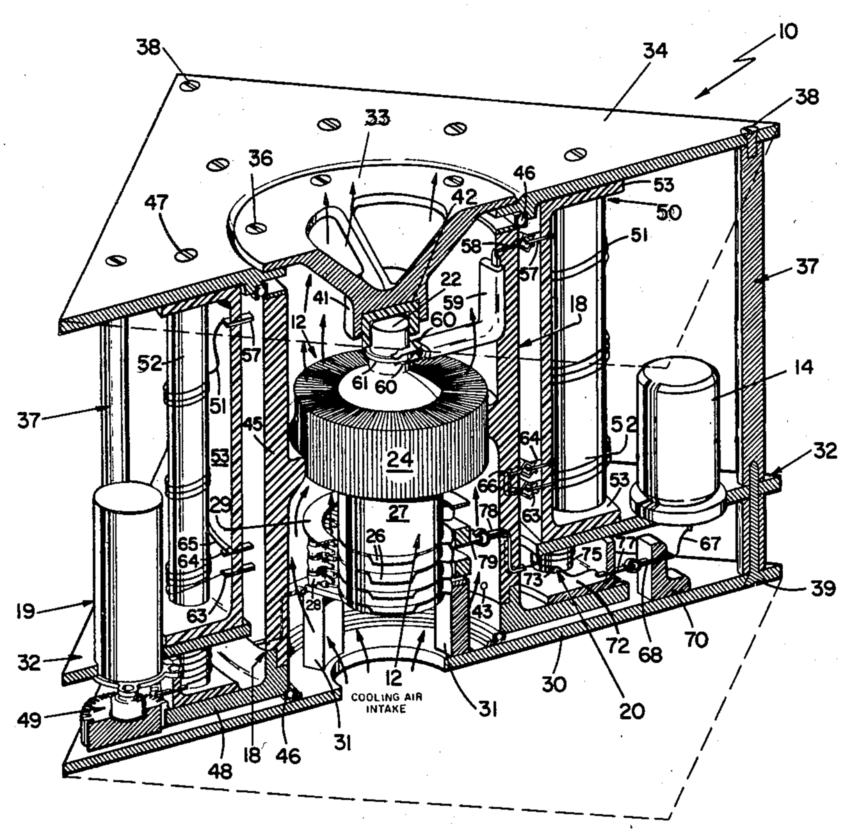
FIG. 1 is a pictorial view, partly in section, of a first embodiment of the invention.

Referring to FIG. 1, a power amplifier and driver module or turret 10 is shown which includes a power amplifier tube 12, a driver tube 14, a stationary array of power amplifier tuned circuit assemblies 50, a rotating cylinder or chimney 18 driven by a motor 19, and a rotating array of circularly arranged input or driver tuned circuits 20 rotating with the chimney 18.

The power amplifier tube 12 is a high power transmitting tube such as an Eimac 4CX1000A ceramic and metal, forced-air cooled tube. An anode cooler including an end cap 22 and cooling fins 24 forms a portion of the tube envelope. Either the end cap or the cooling fins may be used as the output electrode. The remaining tube electrodes terminate in corresponding tabs 26 projecting radially from the ceramic envelope portion 27 of tube 12. The power amplifier tube socket 29 is mounted from the base 30 of the module 10 by stand-off insulators 31. The power amplifier tube 12 is held firmly in position in the socket by rotating the tube slightly until the tabs 26 engage resilient socket clips 28.

When severe shock and vibration is encountered, it is sometimes advisable to provide additional support for the tube 12. This support means includes a supporting spider 33 secured to plate 34 by screws 36. The upper plate 34, the base plate 30 and an intermediate plate 32 are mounted in spaced relation by means of a series of posts 37 attached at one end to plate 34 by fastening screws 38 and at the other end to the base plate 30 by screws 39. The hub portion 41 of the spider 33 contains an insert 42 made of a material, such as beryllium oxide, which engages the end cap 22 of the power amplifier tube 12. The inserts 42 serve not only to insulate the supporting spider from anode voltage but also serve as a heat sink to the turret frame.

Surrounding the power amplifier tube 12 is a hollow cylinder or chimney 18. The major portion 45 of this chimney is made of an electrically insulating material, such as molded silicon resin, re-enforced by fiberglass; this portion 45 contains a plurality of electric switch contact blades, to be described subsequently. The cylinder 18 is adapted to rotate on bearings 46, contacting both the upper plate 34 and the base plate 30. The chimney 18 further contains a lower flange portion 48 secured, as by screws 43, to the major portion 45 of chimney 18. The portion 48 is made of metal and its outer periphery contains teeth to form a gear. A motor 19, supported by the plate 32, intermediate plates 30 and 34, imparts rotation to the chimney 18 through the medium of a pinion 49 engaging the gear teeth on the periphery of the flange portion 48 of chimney 45. Circulating air, as from a fan mounted near the bottom of the turret frame, is directed by the chimney 18 past the cooling fins of the power amplifier tube 12 and out through the other end of the frame. The direction of air movement is indicated by arrows.

Adjacent to and surrounding the chimney 18 is a circumferential array of output tuned circuit assemblies 50, each of which includes one or more coils 51 wound upon a coil form 52. Also included in each tuned circuit assembly 50 is one or more capacitive elements which are omitted in FIG. 1, for the sake of clarity. Each of the forms 52 is mounted between a corresponding bracket 53 of electrically insulating material, as by cementing the coil form to the flange portions of the bracket 53. The bracket 53 is attached to the upper plate 34 by screws 47 and to the intermediate plate 32 by screws, not visible in FIG. 1. The circuit components used with the tuned circuit assemblies 50 depend upon the electric characteristics desired and obviously will vary with different applications. Furthermore, the size of the various assemblies 50 will depend in part upon the frequency at which the corresponding tuned circuit assembly is designed to operate.

The input end of each output tuned circuit is connected to a stationary contact blade 57 extending through the bracket 53 adjacent upper plate 34. These contacts are adapted to engage selectively a single rotating contact 58 extending through the chimney 18. The contact 58 is connected through a flexible cable 59 having spring fingers 60 at one end resiliently engaging a rim 61 on the anode cap 22. An alternate form of connection between the output tuned circuits and the power amplifier tube 12 is illustrated in FIGS. 2 and 4, to be described subsequently.

The output end of each output tuned circuit is connected to a contact blade 63 mounted on the corresponding bracket 53. An output contact blade 64 also is mounted on each bracket 53 adjacent the associated contact blade 63. An output wire or ring 65, a portion of which is visible in FIG. 1, interconnects each of the contact blades 64. An output lead may be attached at some point along the output ring and brought out from the turret module 10 for connection to external equipment, such as an antenna coupling device. An electrical connection between a given set of contact blades 63 and 64 is achieved by means of an electrically conductive loop 66 mounted on the rotary chimney 18 and terminating at either end in stationary contacts which engage the respective contact blades 63 and 64 of the selected tuned circuit assembly 50. The purpose of this bridge or loop 66 and the separate output ring 65 is to isolate the selected output tuned circuit from the remaining output tuned circuits while maintaining a simple compact circuit lead arrangement for the various output tuned circuits.

The driver stage for the power amplifier tube 12 includes a driver tube 14 supported on intermediate plate 32 of the turret frame and a circumferentially disposed array of input or driver tuned circuits 20. A short lead 67 connected to an output electrode of the driver tube 14 is attached to a stationary contact blade 68 mounted on an electrically insulated post 70; the post 70, in turn, is affixed to base plate 30 adjacent the array of driver tuned circuits. The input tuned circuits 20 are each supported on a bracket 72 of electrically insulating material which is secured to the metal flanged portions 48 of the rotating chimney 18. The individual input tuned circuits comprise one or more coils 73 wound about a coil form 75 which is mounted on the bracket 72 by appropriate fastening means. The input tuned circuits also include capacitive elements, not shown for the sake of clarity, which may be connected to the inductive portion of the tuned circuit at appropriate points, depending upon the characteristics of the input tuned circuits desired. One terminal of each input tuned circuit 20 is connected to a contact blade 77 mounted in bracket 72. This rotary contact blade 77 is arranged to engage the stationary contact blade 68 when the chimney 18 is properly positioned for selection of the corresponding input tuned circuit. There is, of course, a contact blade 77 for each input tuned circuit assembly 20. The other terminal of each tuned circuit 20 is connected to a contactor 78 passing through and supported within the rotating chimney 18. There is one of these contactors 78 for each of the input tuned circuits. This rotary contactor 78 selectively engages a single extension 79 of one of the resilient socket clips 28 of the power amplifier tube socket 29 which provides connection internally to the control electrode of the power amplifier tube 12. The extension 79 must be of sufficiently short peripheral length to avoid the possibility of more than one tune circuit contactor 78 being connected simultaneously to the power amplifier tube. It will be noted that the rotating driver tuned circuits 20 are positioned in proximity with the driver tube 14 and with the power amplifier tube 12, thereby minimizing the lengths of the electrical leads, including lead 67 and contactor blades 68 and 77, between the driver tube 14 and the selected driver tuned circuit 20, as well as minimizing the lead length, including contactor 78, between the selected driver tuned circuit 20 and the power amplifier tube 12. Since the output tuned circuits 50 are located in proximity with the rotating chimney 18 which, in turn, is adjacent the power amplifier tube 12, the length of the electrical lead, including conductor 59 and contact blades 57 and 58, between the power amplifier tube 12 and the output tuned circuit 50, is relatively short.

Because the driver tuned circuits are located so close to the power amplifier tube socket, the radial distance of the rotating mass represented by the array of driver tuned circuits 20 from the axis of rotation is comparatively small and the mass polar moment of inertia of the turret 10—proportional to the square of the radius of the moving mass—is correspondingly low. The lower the inertia, the less the time required for selectively repositioning the turret and the more rapid is the tuning.

Although the turret tuner of FIG. 1 is specifically adapted for applications wherein the number of input tuned circuits is equal to the number of output tuned circuits, the device of FIG. 1 may be modified for switching of an unlike number of input and output tuned circuits provided that broad rotary contact blades can be tolerated. If, for example, the switch contact blade 58 of FIG. 1 were sufficiently wide to contact more than one stationary contact blade 57 at some given position of the turret, it is possible to design a tuner wherein more than one output circuit can be used in combination with a given input tuned circuit. Similarly, it is feasible to design a tuner wherein one or more input tuned circuits could be used in conjunction with a given output tuned circuit.

FIGS. 2–4 illustrate a second embodiment of the invention which, unlike that of FIG. 1, provides for rotation of the rotary portion of the switching means for the output tuned circuits independently of the rotary portion of the switching means for the input tuned circuits. This arrangement is particularly adapted for operation when the number of output tuned circuits differs from the number of input tuned circuits. In describing the device of FIGS. 2–4, elements similar to those appearing in FIG. 1 will be indicated by like reference numerals, or, in some instances, by reference numerals differing from those designating corresponding elements in FIG. 1 by 100.

As in the turret tuner of FIG. 1, a power amplifier tube 12 is centrally mounted within two concentric arrays of tuned circuit assemblies 150 and 120. The turret tuner frame includes a group of spaced plates 134, 101, 90, 130 and 83 which are supported by posts 137. Each of the posts may be made of separate hollow sections held together as by screws 138 and 139. Cooling fins 24 surrounding the envelope portion 27 of power amplifier 12 assist in dissipating heat generated within the power amplifier tube 12. Cooling air set in motion by a fan 82 (see FIG. 3) mounted between plate 130 and a fan support plate 83 provides for circulation of air through the central aperture in base plate 130 into the lower chimney 218, thence through the upper chimney 118 past the cooling fins 24 and finally through an opening in the top plate 134, as indicated by the arrows.

The device of FIGS. 2–4 includes two separate aligned chimneys 118 and 218 which are driven independently by respective motors 119 and 219.

The lower turret 218 is positioned by a motor control circuit 251 cooperating with a coding means in response to frequency selective command information from a control box 252. The coding means includes a ring 253 having printed circuitry on the upper face and secured to plate 130 by cement or other appropriate fastening means. Coding ring 253 acts in conjunction with a set of resilient fingers 254 insulatedly secured to the gear 197. These resilient fingers contact discrete portions of the coding ring circuitry to provide coded information to the motor control circuit 251 by way of circuit connection 255. When the coded information provided by the coding ring 253 does not correspond to the command information from control box 252, a motor control signal is produced. This motor control signal is carried by circuit connection 256 to motor 219 and causes motor 219 to rotate until the desired position of the lower turret—which is a function of the command information—is achieved.

Similarly, the upper turret 118 is positioned by a second motor control circuit 261 cooperating with a printed circuit coding ring 262, similar to coding ring 253 mentioned above, which functions in response to command information from the same control box 252 that is used for control of the lower turret 218. Resilient contacts 264 may be attached to pinion gear 97 for engaging printed circuitry on the lower surface of the coding ring 262. The output of the motor control circuit 261 is connected to motor 119 by way of circuit connection 266.

Since the turrets 118 and 218 are rotatable in either direction, the motor control circuits may include bi-directional control means for insuring that the respective turret reaches the desired position by the shorter path, thereby further enhancing the speed of tuning.

The motor control circuit and control box arrangement shown in FIG. 3 may also be incorporated in the device of FIG. 1.

The motor 119 is supported by bracket 85 secured, as by screws 86, to a mounting strip 87; the latter is supported by fastening devices 88 to the metal plates 101 and 90. One of the purposes of plate 90 is to electrically shield the input tuned circuits 50 from the output tuned circuits 120. The motor 119 includes a shaft 92 terminating in a shaft bearing 94 provided in the top plate 134. The shaft 92 may include a flexible shaft coupling 93 whose function is well known in the art. Although not shown in FIG. 3, a torque locking and positioning device may be connected to the motor shaft 93 in some instances to provide more positive halting of the motors 119 when repositioning of the rotating chimney 118 for tuning changes is called for. Such a device similarly may be connected to the shaft of motor 219 when repositioning of the rotating chimney 218 is desired. A pinion gear 95 is attached to the shaft 92 of motor 119 and engages the toothed periphery of a gear 97 whose hub portion 97' is fastened to one end of the chimney 118. Gear 97 rotates on bearings 98 mounted between the gear and a ring 99 attached to the metal plate 134. As the motor 119 rotates, it imparts rotation to the upper chimney 118 through the gear train 95, 97.

Each of the output tuned circuit assemblies 150 includes one or more inductive and capacitive elements arranged in accordance with the electrical characteristics desired. At least a portion of the inductive circuitry for each output tuned circuit may be wound on a coil form 103 which is mounted between plates 101 and 90. Each output tuned circuit assembly 150, in addition to the coil form 103 and associated circuitry, includes a metal shield element 104 disposed between adjacent output tuned circuit assemblies, an electrically insulating terminal board 105 attached to the shield 104 by screws 106. The output tuned circuit assembly also includes upper and lower electrically insulating strips 107 apertured at 108 to receive projecting ears 109 at respective ends of the coil form 103, and finally a bracket 110 attached to the respective strips 107 by screws 111 and to the terminal board 105 by screws 112. The bracket 110 is mounted by screws 113 to the plate 101 or plate 90, as the case may be. The shield elements 104 serve to shield each of the output tuned circuits from one another. Each terminal strip 105 provides means for mounting and interconnecting portions of the associated output tuned circuits.

Associated with each of the output tuned circuit assemblies 150 is a corresponding set of stationary contact assemblies 115. The array of contact assemblies 115 is circumferentially mounted between the output tuned circuit assembly 150 and the upper chimney 118. Each contact assembly 115 includes a metal bracket 122 to which is attached a more or less L-shaped electrically insulating contact strip 124. The metal bracket 122 is fixed at top and bottom, respectively, to plates 101 and 90 by screws 123. One terminal of a given output tuned circuit is connected by lead 156 to a contact 157 mounted in the contact strip 124; this contact 157 corresponds to the contact 57 of the device of FIG. 1. A pair of contacts 163 and 164, corresponding to respective contacts 63 and 64 of the device of FIG. 1, is also provided in the contact strip 124.

The upper chimney 118 is provided with a single set of rotating contacts 158, 127, 128 and 129. A dummy contact 132, identical with contact 129, is mounted on the chimney 118 diametrically opposite contact 129 in order to balance the rotating chimney 118; contact 132, however, has no electrical function. Contact 129 is made of a resilient material and engages a ring 131 secured to the periphery of the anode cooling fins 24 surrounding power amplifier tube 12. A short loop 136 interconnects contacts 129 and 158. The other terminal of any given output tuned circuit is connected by way of lead 160 to contact 163 in the contact assembly 115 (FIG. 2). The various contacts 164 in contact assemblies 115 are connected together by wire 165, as in the device of FIG. 1, and an output lead 170 is attached to some point on this wire for connection to a load, such as an antenna. The upper chimney 118 contains an aperture 171 through which a portion of the moving air may be diverted and directed upon the particular output tuned circuit assembly 150 which is active. The air passing through aperture 171 flows in the vicinity of the active output tuned circuit assembly and dissipates heat generated therein. Since only one of the output tuned circuit assemblies is active at any one time, only one aperture 171 is required in upper chimney 118.

The socket of driver tube 114 is mounted to an L-shaped bracket 173 which, in turn, is secured to plate 90 by screws 174. The turret tuner includes a circumferentially disposed array of input tuned circuit assemblies 200 interposed between the driver tube 114 and the lower chimney 218 and adjacent both the driver tube and the lower chimney. Each input tuned circuit assembly 200 includes an input tuned circuit comprising one or more inductive elements and at least one capacitive element connected in circuit therewith. The exact configuration of the input tuned circuits will depend upon the electrical characteristics. In some cases, for example, two mutually coupled coils may be included in the tuned circuit assembly to function as a transformer. The inductive portion of each input tuned circuit may be wound on a form 175 (FIG. 4) supported within a coil mount 176 through which pass a set of rotating contacts 177, 178, 179. The bottom portion of coil mount 176 is secured by projecting ears 181 extending through a metal flange 182 which, in turn, is attached to the outer periphery of lower chimney 218. The upper portion of coil mount 176 terminates in one or more projecting ears 183 which fit into apertures 184 in a resilient disc 186 of spring metal fastened to a metal flange 185 surrounding and attached to the lower chimney 218. Each of the coil mounts 176 may be removed individually by bending slightly a corresponding finger of the resilient disc 186, as shown in dotted lines in FIG. 3.

The means for rotating the lower chimney 218 includes a motor 219 supported on plate 90 by posts 191, as well as a motor shaft 192 (including a shaft coupler 193) which is supported by bearings 194 in plate 130. The driver or input tuned circuit assemblies 200 are driven by motor 219 through a pinion 195 keyed to motor shaft 192 and a gear 197 rotating in bearings 198; the latter are held in place between the gear and a ring 199 attached to plate 130.

One terminal of each input tuned circuit is connected to a contact 201 of a set of rotary contacts 201, 202 and 203 of the corresponding input tuned circuit assembly 200. The remaining contacts 202 and 203 in this set are for supplying appropriate supply voltages, in the usual manner. The contacts 201, 202 and 203 of each input tuned circuit assembly 200 are adapted to selectively engage corresponding stationary contacts 205, 206 and 207 which are carried by a mounting post 208 attached to plate 130 by one or more screws 209. Only one mounting post 208 is provided, since the rotary contacts of any selected input tuned circuit assembly 200 makes contact therewith, depending on the position of lower chimney 218. One of the stationary contacts, namely, contact 205, is connected by lead 211 to the output electrode pin on the socket of driver tube 114.

The other terminal of a given input tuned circuit is connected to one of several contacts 212 extending radially from the periphery of lower chimney 218. The number of such contacts 212 may be equal to the number of input tuned circuit assemblies, whereupon the spacing between the adjacent contacts 212 generally will be substantially equal to the spacing between centers of corresponding adjacent input and tuned circuit assemblies 200. In some instances, however, the periphery of the lower chimney may not be able to accommodate a single row of contacts equal in number to the number of output tunded circuit assemblies. In such cases, two or more rows of staggered contacts 212 may be carried by the chimney 218 and the contact blades 214 on power amplifier tube socket 29 may be interconnected by jumpers.

The rotating contacts 212 on the lower chimney 218 make contact with a single contact blade 214 which is electrically connected to and extends radially from one of several socket clamps 216; the socket clamp in question fits over and tightly grips one of three socket tabs 217 which protrude from the control grid electrode disc 221 of power amplifier tube 12. The other electrode discs 221 are connected internally to other power amplifier tube electrodes such as the heater, cathode and screen grid and fit tightly between the corresponding socket clamps 216 of the stationary power amplifier tube socket 29. The socket clamps 216 for power amplifier tube socket 29 are held in spaced relationship with one another and are electrically insulated from each other by a series of stacked insulating collars 222; elongated screws 224 pass through the collars 222 and to stand-off insulators 31 for mounting the socket 29 to the plate 130.

While there has been disclosed what is at present considered to be the preferred embodiment of the invention, other modifications will readily occur to those skilled in the art. It is not therefore desired that the invention be limited to the specific arrangement shown and described and it is intended in the appended claims to cover all such modifications as fall within the true spirit and scope of the invention.

What is claimed is:

1. A turret assembly for operation with a fixedly mounted electron device comprising hollow rotating cylindrical means positioned adjacent said electron device, a first array of tuned circuit assemblies mounted to rotate with said rotating means about said electron device, and a second array of circuit assemblies disposed adjacent said rotating means, said rotating means having mounted therein at one angular position only radially disposed contact means for switching between a selected one of each of the first array assemblies and said electron device, said rotating means further having mounted therein second radially disposed contact means located at one angular position only for switching between a selected one of said second array assemblies and said electron device.

2. In combination, a fixedly mounted electron device, a hollow rotating cylindrical member positioned adjacent said electron device, a first array of circumferentially arranged circuit elements mounted to rotate with said rotating member about said electron device, a second array of fixedly mounted output circuit elements circumferentially disposed adjacent said rotating member, and means including said rotating member for switching between selected circuit elements of each of the aforesaid arrays and said electron device, said rotating member constituting a chimney for directing a cooling fluid in the vicinity of said electron device.

3. In combination, a fixedly mounted electron device, first and second rotating cylindrical members each having a common axis of rotation and positioned adjacent said electron device, a first array of circumferentially arranged circuit assemblies mounted to rotate with said first rotating member about said electron device, a second array of fixedly mounted output circuit assemblies circumferentially disposed adjacent said second rotating member, said first and second rotating members being driven independently, and means including said rotating members for switching between selected ones of each of the aforesaid arrays and said electron device, said rotating member constituting a chimney for directing a cooling fluid in the vicinity of said electron device, said rotating member further containing an aperture juxtaposed with a selected one of said output circuit assemblies for bleeding off a portion of said cooling fluid in the vicinity of said selected output circuit assembly.

4. In combination with fixedly mounted input and output electron devices, a hollow rotating member positioned adjacent and surrounding said output electron device, said input electron device being positioned adjacent and outside said rotating member, a first array of circumferentially disposed input tuned circuit assemblies mounted to rotate with said rotating member about said output electron device, a second array of circumferentially arranged stationary output tuned circuit assemblies disposed adjacent said rotating member, first switching means including said rotating member for switching between each of the aforesaid arrays and said output electron device, and second switching means including said rotating member for switching between said first array of tuned circuit assemblies and said input electron device.

5. In combination, a fixedly mounted input electron device, a fixedly mounted output electron device, a rotating member disposed adjacent said output electron device, a plurality of circumferentially arranged input circuit assemblies mounted to rotate with said rotating member about said output electron device, a stationary member positioned adjacent said input circuit assemblies and including at least one stationary contact for connection to said input electron device, each of said input circuit assemblies including rotary contacting means for selectably engaging said stationary contact of said stationary member, said rotating member carrying contacts for selectively interconnecting one of said input circuit assemblies and said output electron device, and an array of fixedly mounted output circuit assemblies circumferentially disposed adjacent said rotating member, each of said output circuit assemblies being connected to separate stationary contact means, said rotating member including a set of rotary contacts selectively connected to said stationary contact means for connecting a selected output circuit assembly to said output electron device and to a common output terminal.

6. In combination, first and second spaced base plates, an intermediate base plate disposed between said first and second base plates, a stationary input electron device affixed to said intermediate base plate, a stationary output electron device mounted on said first base plate, first and second hollow thin-walled rotating members having a common axis of rotation, said first rotating member being rotatably mounted on said first base plate, said second rotating member being rotatably mounted on said second base plate, a plurality of circumferentially arranged input circuit assemblies mounted to rotate with said first rotating member about said output electron device, an array of fixedly mounted output circuit assemblies circumferentially disposed adjacent said second rotating member, said array of output circuit assemblies having a mass large compared with the mass of said plurality of input circuit assemblies, said output circuit assemblies being mounted between said intermediate base plate and said second base plate, said intermediate base plate electrically shielding said input circuit assemblies and said output circuit assemblies from one another, and means including a fixed contact blade for selectively connecting each of said input circuit assemblies to said input electron device, said first rotating member carrying contacts for selectively interconnecting one of said input circuit assemblies and said output electron device, said second rotating member carrying contacts for connecting a selected one of said output circuit assemblies to said output electron device.

7. In combination, a first electron device, an array of first circuit assemblies a second electron device coupled to said first electron device by a selected one of said first circuit assemblies, an array of second circuit assemblies one of which is selectively coupled to the output circuit of said second electron device, a first rotating sleeve surrounding said second electron device and positioned adjacent thereto, said array of first circuit assemblies mounted adjacent said first sleeve for rotation therewith, each of said first circuit assemblies carrying at least one rotary terminal, a single fixed member positioned adjacent to said array of first circuit assemblies and adjacent to said first electron device, said fixed member mounting at least one fixed terminal connected to said first electron device, said rotary terminal of a selected one of said first circuit assemblies contacting said fixed terminal of said fixed member during selective rotation of said first sleeve, a second rotating sleeve aligned with said first sleeve and positioned adjacent said second electron device, said array of second circuit assemblies being fixedly mounted adjacent said second sleeve and having a set of stationary contacts mounted thereon, one of said set of stationary contacts being connected to an output terminal, a single set of rotating contacts mounted in said second sleeve and arranged to engage a set of stationary contacts of a selected one of said second circuit assemblies, and a resilient fixed contact connecting said second electron device with one of said set of rotating contacts.

8. In combination with fixedly mounted input and output electron devices, first and second aligned hollow rotating members having a common axis of rotation, said hollow rotating members being positioned adjacent and surrounding said output electron device, said input electron device being disposed adjacent and outside said rotating members, a first array of circumferentially disposed input toned circuit assemblies mounted to rotate with said first rotating member about said output electron device, a second array of circumferentially arranged output tuned circuit assemblies mounted to rotate with said second rotating member, means for driving said first and second rotating members independently, first and second switching means mounted respectively on said first and second rotating members for switching between each of the aforesaid arrays and said output electron device, and third switching means including a plurality of circumferentially arranged stationary contacts for switching between said first array of tuned circuit assemblies and said input electron device.

References Cited in the file of this patent

UNITED STATES PATENTS

| | | |
|---|---|---|
| 2,545,681 | Zepp et al. | Mar. 20, 1951 |
| 2,659,820 | Robinson | Nov. 17, 1953 |
| 2,789,227 | Murakami et al. | Apr. 16, 1957 |
| 2,798,955 | Balash | July 9, 1957 |
| 2,810,827 | Nordby | Oct. 22, 1957 |
| 2,817,064 | Carlson | Dec. 17, 1957 |
| 2,858,439 | Tyminski et al. | Oct. 28, 1958 |
| 2,975,276 | Thias | Mar. 14, 1961 |